(12) United States Patent
Farrar (10) Patent No.: US 7,158,399 B2
(45) Date of Patent: Jan. 2, 2007

(54) DIGITAL DATA APPARATUSES AND DIGITAL DATA OPERATIONAL METHODS

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 483 days.

(21) Appl. No.: 10/688,828

(22) Filed: Oct. 17, 2003

(65) Prior Publication Data
US 2005/0082585 A1 Apr. 21, 2005

(51) Int. Cl.
*G11C 11/24* (2006.01)

(52) U.S. Cl. ...................... 365/149; 365/208
(58) Field of Classification Search .................. 365/149
See application file for complete search history.

(56) References Cited

U.S. PATENT DOCUMENTS

| 3,387,282 | A | | 6/1968 | Jaques |
| 5,106,774 | A | * | 4/1992 | Hieda et al. .......... 257/E21.651 |
| 5,920,785 | A | | 7/1999 | Chi et al. |
| 6,184,548 | B1 | | 2/2001 | Chi et al. |
| 2002/0009874 | A1 | | 1/2002 | Farrar et al. |
| 2003/0042489 | A1 | * | 3/2003 | Yang et al. .................... 257/68 |

OTHER PUBLICATIONS

"SEMICONDUCTORS: IBM, Infineon Open Trench Warfare Over 1-Gbit Design;" Anthony Cataldo; http://www.eetimes.com/semi/news/OEG19991028S0038; Oct. 28, 1999; 5 pps.

"A Novel Trench DRAM Cell with a VERtIcal Access Transistor and BuriEd STrap (Very Best) for 4GB/16Gb;" U. Gruening, C.J. Radens, J.A. Mandelman, A. Michaelis, M. Seitz, N. Arnold, D. Lea, D. Casarotto, A. Knorr, S. Halle, T.H. Ivers, L. Economikos, S. Kudelka, S. Raha, H. Tews, H. Lee, R. Divakaruni, J.J. Welser, T. Furukawa, T. S. Kanarsky, J. Alsmeier, G. B. Bronner; printed Sep. 1999; 4 pps.

* cited by examiner

*Primary Examiner*—Thong Q. Le
(74) *Attorney, Agent, or Firm*—Wells St. John, P.S.

(57) ABSTRACT

Digital data apparatuses and digital data operational methods are described. According to one embodiment, a digital data apparatus includes a semiconductive substrate comprising a node location configured to receive an electrical charge of a single bit of digital information, a first capacitor coupled with the node location and configured to store a first portion of the electrical charge of the single bit of digital information, wherein the first capacitor comprises a first type of capacitive structure, a second capacitor coupled with the node location and configured to store a second portion of the electrical charge of the single bit of digital information, wherein the second capacitor comprises a second type of capacitive structure different than the first type of capacitive structure, and a transistor coupled with the node location and configured to control a flow of the first and second portions of the electrical charge of the single bit of digital information with respect to the node location and respective ones of the first and the second capacitors.

39 Claims, 6 Drawing Sheets

DIGITAL DATA APPARATUSES AND DIGITAL DATA OPERATIONAL METHODS

TECHNICAL FIELD

This invention relates to digital data apparatuses and digital data operational methods.

BACKGROUND OF THE INVENTION

Figure 1:
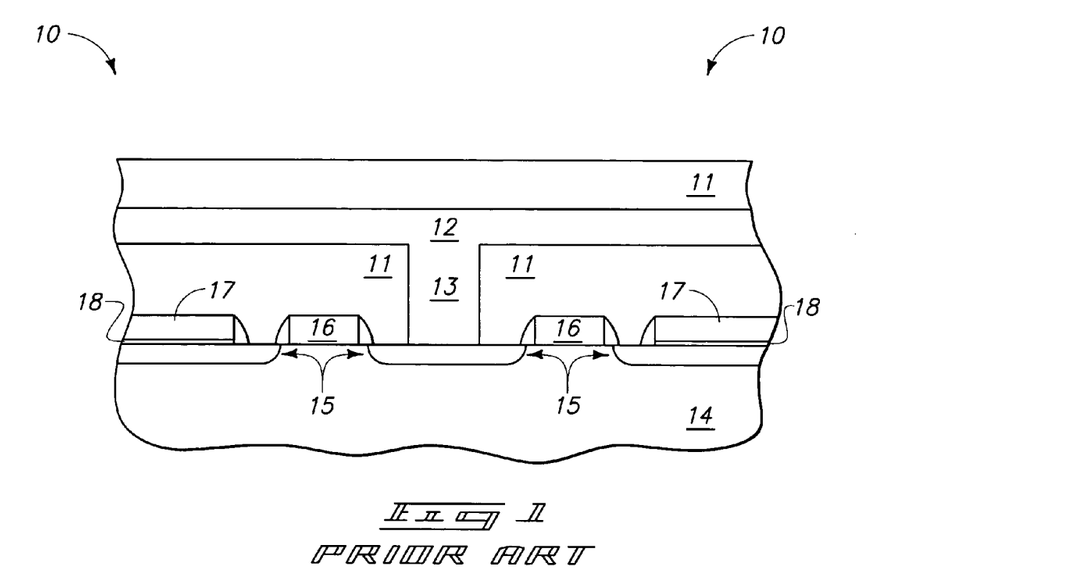
FIG. 1 is an illustrative representation of a conventional planar capacitor memory structure.

Modern high density dynamic memory structures (e.g., dynamic random access memory or DRAM) are based upon a single device plus capacitor storage concept described in U.S. Pat. No. 3,387,282. The first implementation of which used planar capacitors and transistors. An example of one structure using planar structures is shown in FIG. 1. The memory structures 10 individually include interlayer dielectric material 11, a bitline 12, a bitline contact 13, an n-well of a semiconductive substrate 14, p+ active areas 15, a wordline 16, gate polysilicon 17, and gate oxide 18. These structures led to dramatic increases in memory density and decreases in per bit cost. As the density of DRAM increases, the space available for capacitors is reduced.

Figure 2:
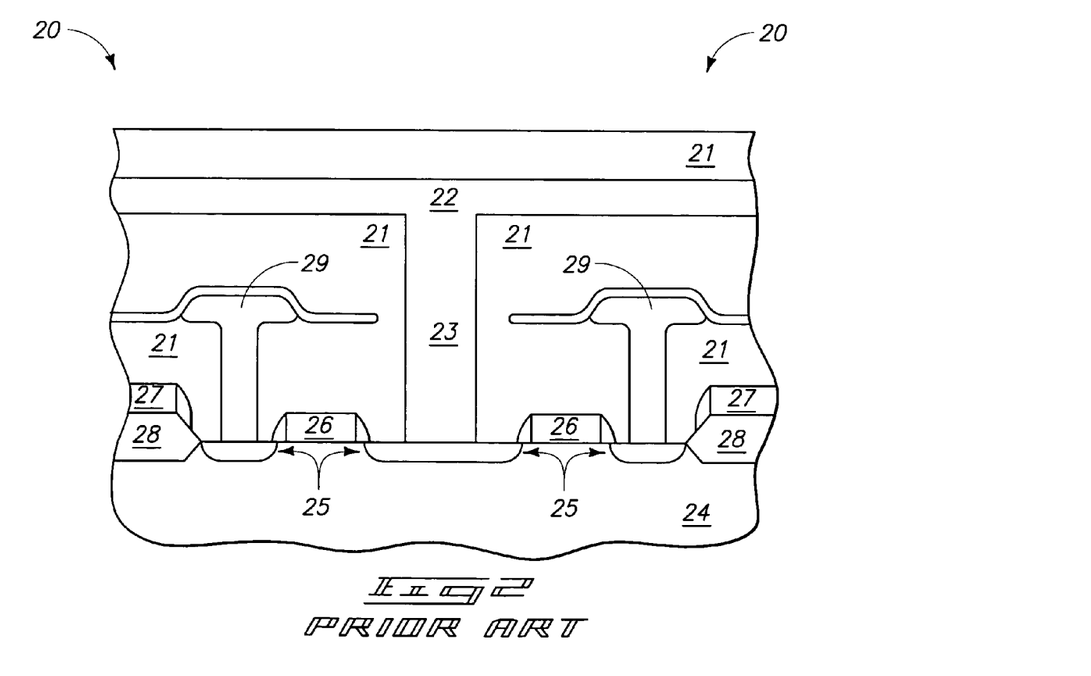
FIG. 2 is an illustrative representation of a conventional stacked capacitor memory structure.
Figure 3:
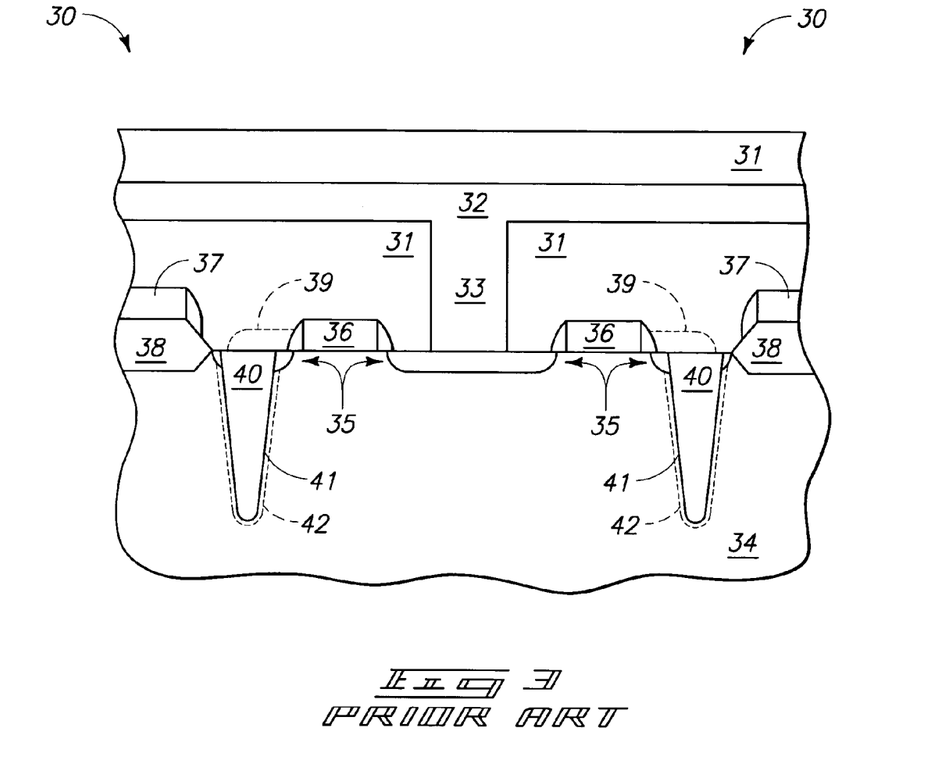
FIG. 3 is an illustrative representation of a conventional trench capacitor memory structure.

The desire for devices of increased density and sufficient capacitance led to the development of new memory structures. Referring to FIGS. 2 and 3, examples of more recently developed devices are shown. FIG. 2 shows exemplary stacked capacitor memory structures 20 individually comprising interlayer dielectric material 21, a bitline 22, a bitline contact 23, a p-substrate 24, n+ active areas 25, a wordline 26, field polysilicon 27, field oxide 28, and cell plates 29.

FIG. 3 shows exemplary trench capacitor memory structures 30 individually comprising interlayer dielectric material 31, a bitline 32, a bitline contact 33, a p– substrate or well 34, n+ active areas 35, a wordline 36, field polysilicon 37, field oxide 38, a polysilicon strap 39, a polysilicon storage node 40, ONC dielectric 41, and a heavily doped substrate region 42. The structures of FIGS. 2 and 3 permitted the use of a vertical capacitor which led to continued increase in density for several generations of DRAM design.

The progress however was not without a cost. The minimum capacitance required for effective electrical operation does not scale with the reduction in achievable photolithographic dimensions (i.e., the size of the capacitor (area) remains relatively constant). To achieve this while reducing the total size of the cell resulted in either an increase in the vertical dimension of the capacitor while the horizontal dimensions were decreased and/or required the thickness of the dielectric to be decreased. Thus, trench capacitors having increasing depth became more difficult to build. Stacked capacitors grew taller and led to processes to roughen the surface (thereby increasing the capacitor area). These improvements including increasing the height of the capacitor structures led to difficulties in producing wiring layers above the capacitor structures along with very high aspect ratio contacts. Proposals have been made to use dielectrics other than Nitride-Oxide combinations typically used. However, these proposals have proved difficult to impossible to implement. There is a desire to increase the space available for construction of the capacitor while at the same time reducing the total cell area.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

According to one embodiment, a digital data apparatus comprises a semiconductive substrate comprising a node location configured to receive an electrical charge of a single bit of digital information, a first capacitor coupled with the node location and configured to store a first portion of the electrical charge of the single bit of digital information, wherein the first capacitor comprises a first type of capacitive structure, a second capacitor coupled with the node location and configured to store a second portion of the electrical charge of the single bit of digital information, wherein the second capacitor comprises a second type of capacitive structure different than the first type of capacitive structure, and a transistor coupled with the node location and configured to control a flow of the first and second portions of the electrical charge of the single bit of digital information with respect to the node location and respective ones of the first and the second capacitors.

According to another embodiment, a digital data apparatus comprises a semiconductive substrate, a first capacitor configured to store a first electrical charge, wherein the first capacitor comprises a first type of capacitive structure, a second capacitor configured to store a second electrical charge, wherein the second capacitor comprises a second type of capacitive structure different than the first type of capacitive structure, a common bitline configured to conduct the first and the second electrical charges, and a plurality of transistors formed using the semiconductive substrate and coupled with the bitline, wherein the transistors are individually configured to control storage of a respective one of the first and the second electrical charges with respect to a respective one of the first and the second capacitors.

According to an additional embodiment, a digital data apparatus comprises a semiconductive substrate comprising a plurality of node locations, a first capacitor configured to store an electrical charge for a first bit of digital information, wherein the first capacitor comprises a first type of capacitive structure coupled with a first of the node locations, a second capacitor configured to store an electrical charge for a second bit of digital information, wherein the second capacitor comprises a second type of capacitive structure different than the first type of capacitive structure and coupled with a second of the node locations, a plurality of bitlines individually configured to conduct an electrical charge with respect to a respective one of the first and second node locations, and a plurality of transistors formed coupled with respective ones of the bitlines, wherein the transistors are individually configured to control a flow of the respective electrical charges intermediate respective ones of the first and the second capacitors and the respective ones of the bitlines.

According to another additional embodiment, a digital data apparatus comprises substrate means having an associated horizontal reference line, first storage means for storing a first electrical charge corresponding to a single bit of digital information, wherein the first storage means is positioned elevationally above the horizontal reference line, second storage means for storing a second electrical charge corresponding to the single bit of digital information, wherein the second storage means is positioned elevationally below the horizontal reference line, and control means for selectively communicating respective ones of the first and the second electrical charges with respect to respective ones of the first storage means and the second storage means.

According to yet another embodiment, a digital data apparatus comprises memory comprising a semiconductive substrate, a trench capacitor configured to store a first electrical charge, a stacked capacitor configured to store a second electrical charge, a common bitline configured to conduct the first and the second electrical charges, and a plurality of transistors formed using the semiconductive substrate and coupled with the bitline, wherein the transistors are individually configured to control storage of a respective one of the first and the second electrical charges with respect to a respective one of the first and the second capacitors, and processing circuitry electrically coupled with the memory and configured to control the generation of the first and the second electrical charges.

According to still another embodiment, a digital data operational method comprises providing a plurality of capacitors comprising a plurality of different types of structures using a semiconductive substrate, communicating an electrical charge corresponding to a single bit of digital information using a bitline, storing the electrical charge of the single bit of digital information using plural ones of the capacitors comprising different types of capacitive structures, and controlling communication of the electrical charge intermediate the capacitors and the bitline using a transistor to read and write the bit of digital information with respect to the capacitors.

According to yet another additional embodiment, a digital data operational method comprises providing a plurality of capacitors comprising different types of capacitive structures using a semiconductive substrate, communicating a plurality of electrical charges using a common bitline coupled with the capacitors, storing one of the electrical charges from the bitline using one of the capacitors having a first type of capacitive structure, and storing an other of the electrical charges from the bitline using an other of the capacitors having a second type of capacitive structure different than the first type of capacitive structure.

Figure 4:
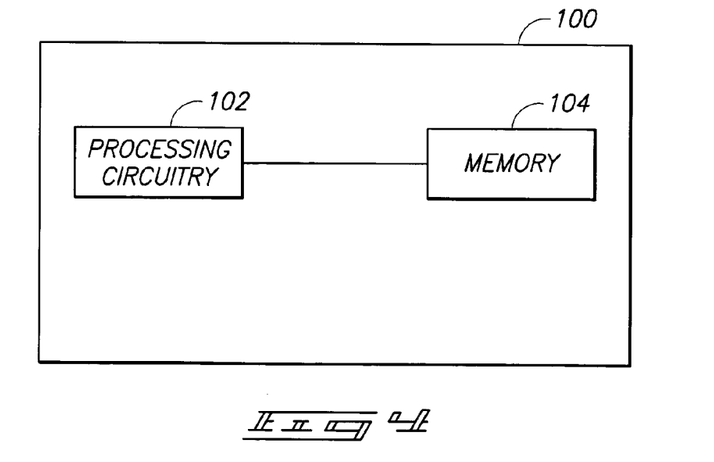
FIG. 4 is a functional block diagram of an exemplary digital data apparatus according to one embodiment.

Referring to FIG. 4, an exemplary digital data apparatus is illustrated with respect to reference 100. The depicted digital data apparatus 100 is configured to access, execute, modify, and/or store digital data. Digital data may comprise digitized representations of analog data or other information, executable instructions (e.g., software, firmware, etc.), or any other digital information represented as bits having a plurality of logical states (e.g., logical 0, logical 1).

In one embodiment, digital data apparatus 100 comprises processing circuitry 102 and memory 104. Processing circuitry 102 is arranged to process and communicate (e.g., access and/or write) digital data with respect to memory 104. For example, processing circuitry 102 may control a content of the bits of digital information individually comprising one of a plurality of logical states. Alternatively, the content of the bits may be otherwise determined. Processing circuitry 102 may control writing of the bits to memory 104 and/or reading the bits from memory 104. Processing circuitry 102 may be embodied as a microprocessor (e.g., Pentium processor available from Intel Corporation), microcontroller, hardware logic, PGA, FPGA, ASIC, and/or other structure configured to process digital data.

Memory 104 is configured to store digital data received from any appropriate source (e.g., processing circuitry 102), and to output the stored digital data. Exemplary memory 104 comprises dynamic random access memory (DRAM) formed using a semiconductive substrate. Memory 104 may comprise a plurality of storage locations or cells configured in an array to store respective bits of digital information. A plurality of bitlines and wordlines may be used to implement addressing of the storage locations. Exemplary embodiments illustrating details of memory 104 are described below with respect to FIGS. 5–11.

Figure 5:
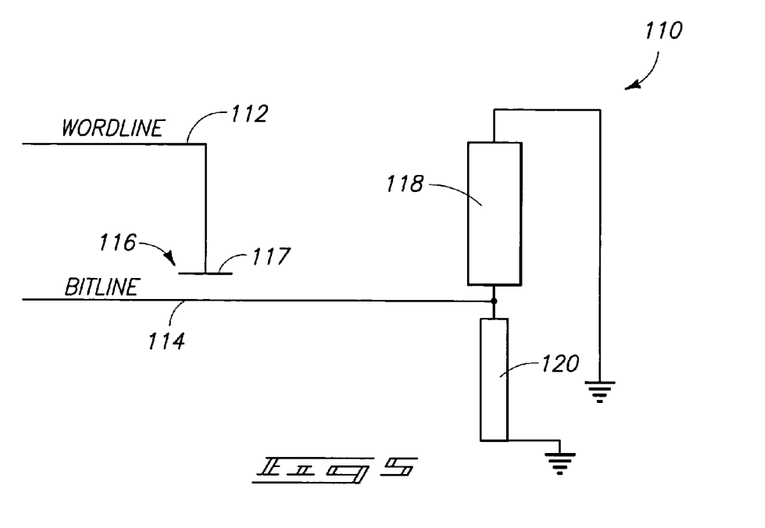
FIG. 5 is a schematic representation of an exemplary memory structure according to one embodiment.

Referring to FIG. 5, an electrical schematic representation of a first memory structure 110 is shown. Memory structure 110 may be implemented within memory 104 to store digital information in one embodiment.

Structure 110 comprises a common wordline 112, a common bitline 114, a transistor 116 having a gate 117, and a plurality of capacitors 118, 120 in the depicted example. Wordline 112 and bitline 114 are configured to control reading and writing of digital data with respect to capacitors 118, 120. Wordline 112 and/or bitline 114 may be referred to as conductive structures herein. Common conductive structures (wordline 112 or bitline 114) refer to a structure common to or associated with both capacitors 118, 120. Structure 110 comprises a memory cell configured to store a single bit of digital information using capacitors 118, 120 in the illustrated embodiment. For example, capacitors 118, 120 may store respective portions of an electrical signal or charge of the single bit of digital information. A single transistor 116 controls the stored charge in both capacitors 118, 120 in the depicted exemplary arrangement. Transistor 116 may be implemented as a field effect transistor FET. Gate 117 of transistor 116 is coupled with wordline 112 in the illustrated example. A source of transistor 116 is coupled with bitline 114 and a drain of transistor 116 may be coupled with a respective plate or pole of capacitors 118, 120 (e.g., the source and drain are not specifically shown in FIG. 5). The other poles of respective capacitors 118, 120 may be coupled with ground. In one embodiment, capacitors 118, 120 comprise different types of capacitive structures. For example, capacitor 118 may comprise a stacked capacitor and capacitor 120 may comprise a trench capacitor 120 in one embodiment.

During exemplary write operations, charge may be communicated or supplied via bitline 114. A voltage on wordline 112 results in current flowing into respective capacitors 118, 120. For exemplary read operations, electrical charge (if any) stored within capacitors 118, 120 discharges to bitline 114 responsive to a voltage on wordline 112. In the illustrated example, capacitors 118, 120 of memory structure 100 comprise a single storage node permitting one bit of digital information to be stored.

Figure 6:
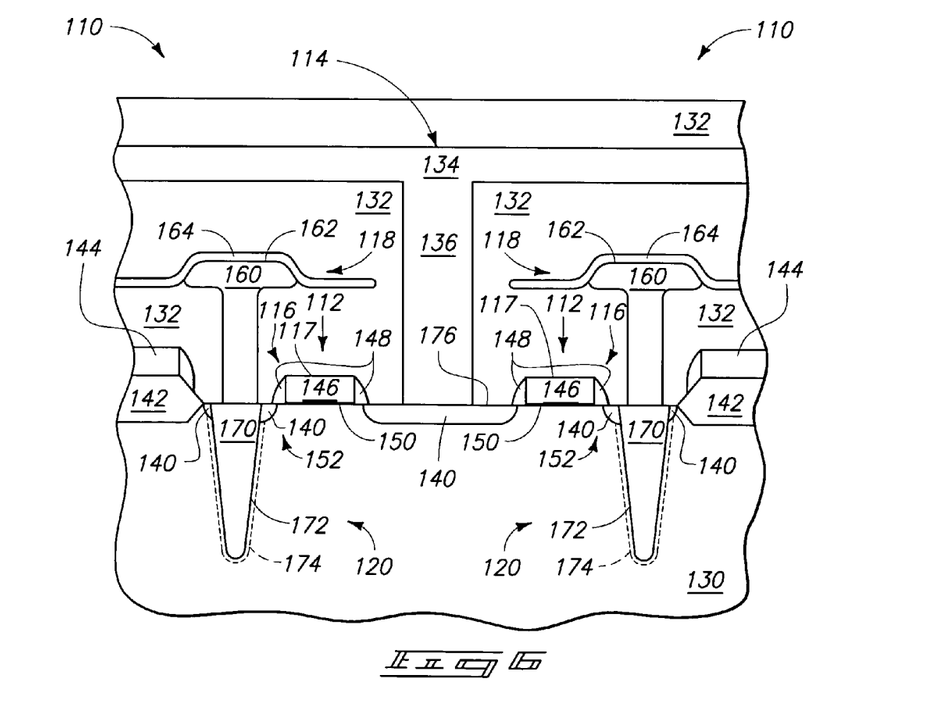
FIG. 6 is an illustrative representation of an exemplary configuration of the memory structure shown in FIG. 5.

Referring to FIG. 6, an exemplary physical representation of two first memory structures 110 is shown. First memory structures 110 are configured to individually store a single bit of digital information. Two structures 110 are illustrated to depict one possible fabrication implementation wherein some common device structures (e.g., bitline structures) are shared between structures 110 to improve density. The wordlines 112 may be separately and independently controlled in one embodiment to provide respective read and write operations for individual structures 110. Other arrangements are possible including coupling only one structure 110 per bitline structure. Further alternately, plural individual structures 110 may be controlled to share an electrical charge of a single bit of digital information.

First memory structure 110 comprises a semiconductive substrate 130. Semiconductive substrates herein include constructions comprising semiconductive material, including, but not limited to, bulk semiconductive materials such as a semiconductive wafer (either alone or in assemblies comprising other materials thereon), and semiconductive material layers (either alone or in assemblies comprising other materials). The term substrate refers to any supporting structure, including, but not limited to, the semiconductive substrates described above. Exemplary semiconductive substrates described herein comprise p-type substrates or wells.

Interlayer dielectric material 132 is provided over the substrate 130 in the illustrated example. Bitline material 134 is formed over at least some of dielectric material 132. A bitline contact 136 provides vertical electrical communication of electrical signals in the depicted exemplary configuration. Bitline material 134 and bitline contact 136 may correspond to bitline 114 of FIG. 5. Dielectric material 132 may comprise BPSG and material 134 and contact 136 may comprise polysilicon and/or metal in one embodiment.

A plurality of active areas 140 are formed using the semiconductive substrate 130. Exemplary active areas described herein may comprise n+ diffusion regions in one example. Field oxide regions 142 are formed intermediate substrate 130 and dielectric material 132 and may comprise silicon dioxide. Field polysilicon regions 144 are formed adjacent field oxide regions 142. Wordline material 146 is formed adjacent to bitline contact 136. Wordline material 146 forms a plurality of wordlines 112 for the respective memory structures 110. Exemplary wordlines 112 comprise polysilicon with associated silicide intermediate respective insulative spacers 148. Wordlines 112 have associated gate oxide regions 150 and individually form a transistor 116 (wordlines 112 may individually comprise a gate 117 of transistor 116 of FIG. 5) with associated adjacent active areas 140.

The memory structures 110 individually include a respective pair of capacitors 118, 120 as described with respect to FIG. 5. Exemplary capacitors 118, 120 comprise different types of capacitive structures and comprise a stacked capacitor and a trench capacitor, respectively, in the example of FIG. 6. An exemplary stacked capacitor comprises a metal-insulator-metal (MIM) capacitor.

Capacitors 118, 120 of a structure 110 are coupled with a respective node location 152. Node locations 152 may be individually implemented using a respective active area 140 as shown in FIG. 6. Responsive to operations of respective transistors 116, node locations 152 receive electrical charge (also referred to as electrical signals) from bitline 114 and correspond to respective single bits of information. Capacitors 118, 120 operate to store any electrical charge present at a respective node location 152 when the associated transistor 116 electrically insulates the respective pairs of capacitors 118, 120 from bitline 114. Transistors 116 are configured to control the flow of electrical charge to and from the respective pairs of capacitors 118, 120 responsive to control signals from appropriate addressing circuitry (not shown). The addressing circuitry may control transistors 116 to address the respective memory structures 110 at appropriate moments in time to share the common bitline 114.

Capacitors 118, 120 may store respective portions of an electrical charge of a bit as mentioned above. In one embodiment, capacitors 118, 120 are designed such that the electrical charge stored within one device is substantially equal to the electrical charge stored within the other device. Capacitor 118 may comprise a stacked capacitor as mentioned above and as shown in FIG. 6. Capacitor 118 configured as a stacked capacitor comprises an electrical storage component comprising a metal or polysilicon storage structure 160, intermediate dielectric layer 162, and a metal cell plate 164 in the depicted embodiment.

Capacitor 120 may comprise a trench capacitor as mentioned above and as shown in FIG. 6. Capacitor 120 configured as a trench capacitor comprises an electrical storage component comprising a polysilicon storage structure 170, an intermediate dielectric layer 172, and a heavily doped substrate region 174 in the depicted embodiment. In exemplary trench constructions described herein, dielectric layer 172 may comprise ONC dielectric material and heavily doped substrate regions may comprise n+ regions (e.g., in an exemplary arrangement having a p-type substrate or well). Pairs of capacitors 118, 120 of structures 110 comprise respective cells individually configured to store a single bit of digital information.

A horizontal reference line may be defined wherein a substantial portion of the storage component of capacitor 118 is formed elevationally above the horizontal reference line and a substantial portion of the storage component of capacitor 120 is formed elevationally below the horizontal reference line. For example, the horizontal reference line may correspond to a surface 176 of substrate 130 in the depicted example.

Figure 7:
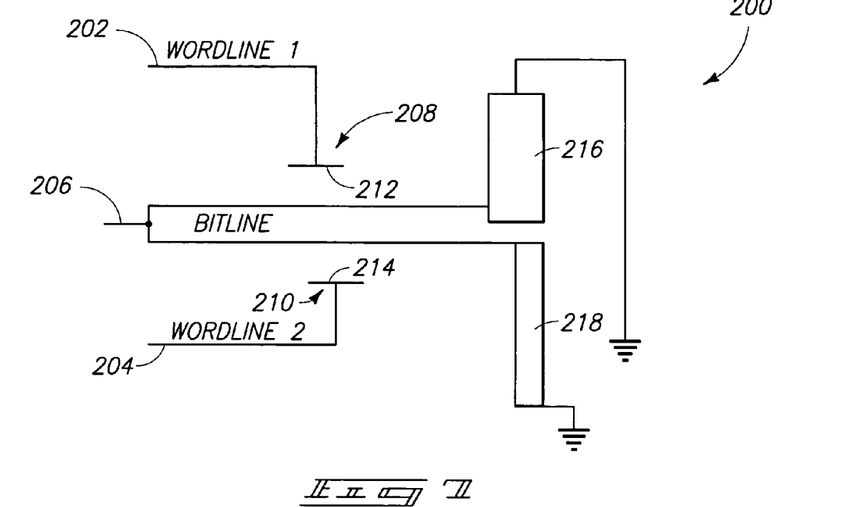
FIG. 7 is a schematic representation of an exemplary memory structure according to one embodiment.

Referring to FIG. 7, an electrical schematic representation of a second memory structure 200 is shown. Memory structure 200 may be implemented within memory 104 to store digital information in one embodiment.

Structure 200 comprises a plurality of separate wordlines 202, 204 (e.g., separate wordlines 202, 204 correspond to respective capacitors 216, 218), a single common shared bitline 206, a plurality of transistors 208, 210 having respective gates 212, 214, and a plurality of capacitors 216, 218 in the depicted exemplary arrangement. Structure 200 comprises a plurality of memory cells individually corresponding to one of the capacitors 216, 218 and individually configured to store a single bit of digital information. In one embodiment, capacitors 216, 218 comprise different capacitive structures. For example, capacitor 216 may comprise a stacked capacitor and capacitor 218 may comprise a trench capacitor in one embodiment. In the illustrated example, capacitors 216, 218 of memory structure 200 comprise independent storage nodes permitting two bits of digital information to be stored at a single location and using a single bitline 206.

Figure 8:
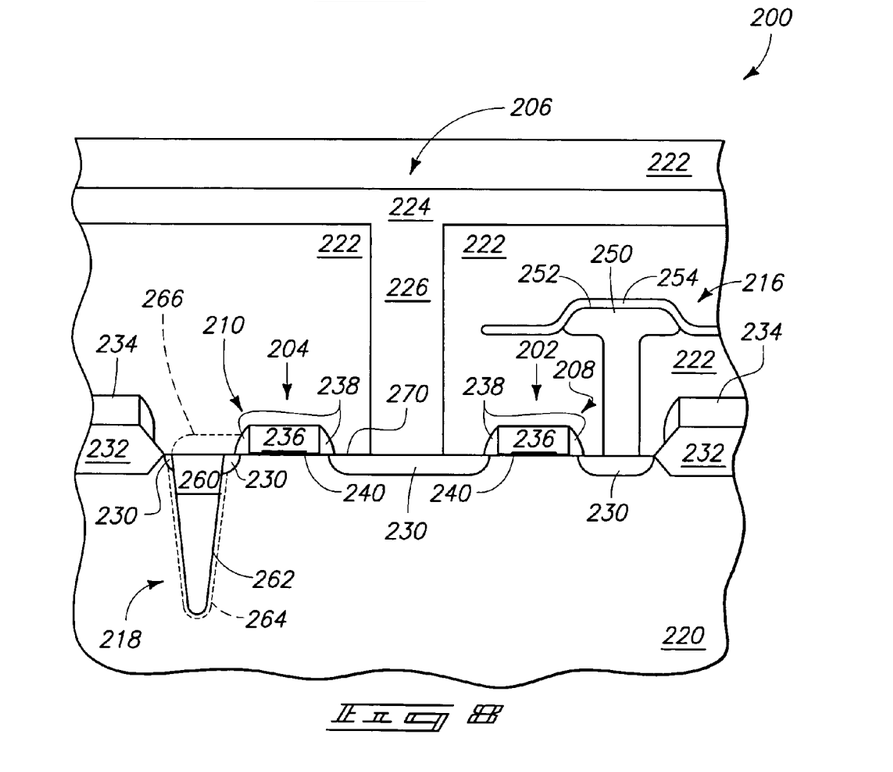
FIG. 8 is an illustrative representation of an exemplary configuration of the memory structure shown in FIG. 7.

FIG. 8 depicts an exemplary physical representation of second memory structure 200 comprising plural capacitors 216, 218 individually configured to store a single bit of digital information. The illustrated example shows one possible fabrication implementation wherein some common device structures (e.g., bitline structures) are shared to improve density. Memory structure 200 may be arranged in one embodiment to provide capacitors 216, 218 in a checkerboard pattern (e.g., in an unillustrated plan view) wherein trench capacitors (e.g., 218) extend under alternating stacked capacitors (e.g., 216) and stacked capacitors are mushroom-shaped extending over adjacent trench capacitors. Other arrangements are possible.

Second memory structure 200 comprises a semiconductive substrate 220. Interlayer dielectric material 222 and bitline material 224 are formed over semiconductive substrate 220. A bitline contact 226 provides vertical electrical communication of electrical signals. Bitline layer 224 and bitline material 226 may correspond to bitline 206 of FIG. 7.

Plural active areas 230 are formed using substrate 220. Field oxide regions 232 may be provided intermediate substrate 220 and dielectric material 222. Field polysilicon regions 234 are formed adjacent to field oxide regions 232. Wordline material 236 is formed adjacent to opposite sides of bitline contact 226. Wordline material 236 may comprise polysilicon intermediate respective insulative spacers 238 and form wordlines 202, 204 of FIG. 7. Respective formations of wordline material 236 are adjacent to associated gate oxide regions 240 and form respective transistors 208, 210 (wordlines 236 may comprise gates 212, 214 of FIG. 7) with associated adjacent active areas 230.

Memory structure 200 comprises capacitors 216, 218. As shown in the exemplary embodiment, capacitors 216, 218 respectively comprise a stacked capacitor and a trench capacitor. Capacitors 216, 218 individually operate to store a single bit of information responsive to operation of respective transistors 208, 210.

Capacitor 216 configured as a stacked capacitor comprises an electrical storage component comprising a metal or polysilicon storage structure 250, intermediate dielectric layer 252, and a metal or polysilicon cell plate 254 in the depicted embodiment.

Capacitor 218 configured as a trench capacitor comprises an electrical storage component comprising polysilicon storage structure 260, intermediate dielectric layer 262, and a heavily doped substrate region 264 in the depicted embodiment. A polysilicon strap 266 may be provided to provide electrical communication between polysilicon storage structure 260 and a drain of transistor 218.

Another horizontal reference line may be defined wherein a substantial portion of the storage component of capacitor 216 is formed elevationally above the horizontal reference line and a substantial portion of the storage component of capacitor 218 is formed elevationally below the horizontal reference line. The horizontal reference line may correspond to a surface 270 of substrate 220 in the depicted example.

As mentioned previously, capacitors 216, 218 are coupled with and share a single bitline 206. Transistors 216, 218 may be controlled by the respective wordlines 236 to selectively couple respective capacitors 216, 218 with bitline 206 to enable different bits of information to be written to or accessed from capacitors 216, 218. For example, capacitor 216 may only be coupled with bitline 206 at a first moment in time and capacitor 218 may only be coupled with bitline 206 at a second moment in time. In other operational embodiments, both capacitors 216, 218 may be simultaneously coupled with bitline 206 to enable a single bit of information to be written to or accessed from capacitors 216, 218.

Figure 8A:
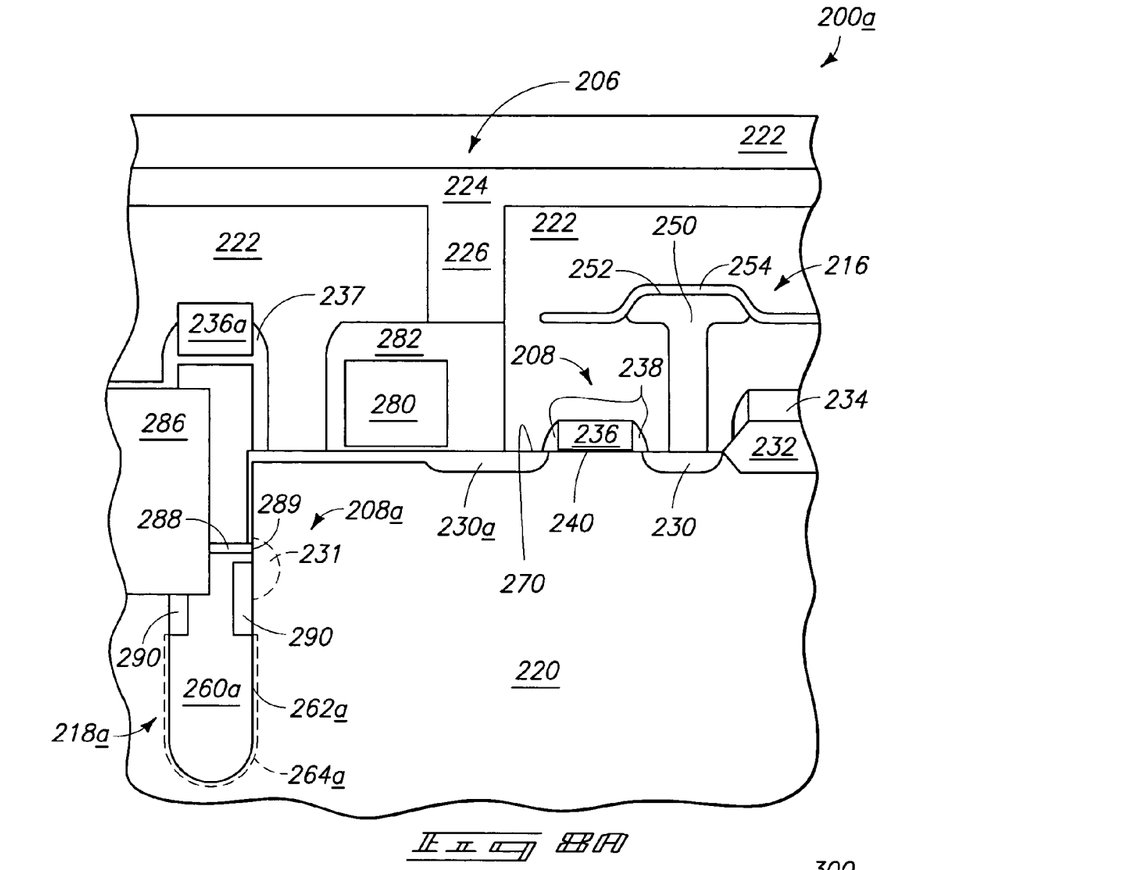
FIG. 8A is an illustrative representation of another exemplary configuration of the memory structure shown in FIG. 7.

Referring to FIG. 8A, an alternate configuration of the embodiment shown in FIG. 8 is illustrated as a memory structure 200a. Like numerals correspond to like components with differences therebetween being represented by a suffix, such as "a." Structure 200a comprises stacked capacitor 216 and an alternate trench capacitor 218a. Stacked and trench capacitors 216, 218a may be provided in a checkerboard pattern similar to the construction of FIG. 8.

In the illustrated embodiment, trench capacitor 218a is coupled with a buried transistor 208a which is configured to control reading and writing of data with respect to trench capacitor 218a. Transistor 208a associated with trench capacitor 218a is formed below surface 270 of semiconductive substrate 220 and adjacent a sidewall of the trench of the trench capacitor 218a. Trench capacitor 218a comprises a polysilicon storage structure 260a, an intermediate dielectric layer 262a, and a heavily doped substrate region 264a in the depicted embodiment.

Bitline contact 226 is configured to provide electrical connection with active area 230a. A passing wordline 280 and associated silicide 282 provide control of data reading and writing to an adjacent memory structure (not shown), for example, arranged in a checkerboard pattern. Active area 230a extends an increased lateral distance towards capacitor 218a in the embodiment of FIG. 8A compared with the embodiment of FIG. 8.

Wordline material 236a is illustrated elevationally over capacitor 218a and has associated silicide material 237. Wordline 236a is configured to control the operation of buried transistor 208a including the reading and writing of data with respect to trench capacitor 218a. A shallow trench isolation region 286 is depicted for isolating node 260a from active region 230a. A deep strap 288 comprising polysilicon is illustrated for establishing electrical connection with wordline 236a and terminating adjacent to a gate 289 of transistor 208a. An active (e.g., n+ region) region 231 is provided to create a channel region to selectively couple node 260a with active area 230a responsive to control signals provided via wordline 236a and deep strap 289. Transistor 208a selectively couples node 260a with active area 230a in the depicted embodiment. An oxide collar 290 operates to insulate heavily doped substrate region 264a of capacitor 218a from region 231. Additional details regarding exemplary buried transistors 208a are described in "SEMICONDUCTORS: IBM, Infineon Open Trench Warfare Over 1-Gbit Design," listing Anthony Cataldo as author, http://www.eetimes.com/semi/news/OEG19991028S0038; Oct. 28, 1999, and "A Novel Trench DRAM Cell with a VERtIcal Access Transistor and BuriEd STrap (VERY BEST) for 4 GB/16 Gb," listing U. Gruening, C. J. Radens, J. A. Mandelman, A. Michaelis, M. Seitz, N. Arnold, D. Lea, D. Casarotto, A. Knorr, S. Halle, T. H. Ivers, L. Economikos, S. Kudelka, S. Raha, H. Tews, H. Lee, R. Divakaruni, J. J. Welser, T. Furukawa, T. S. Kanarsky, J. Alsmeier, G. B. Bronner as authors, printed September, 1999, the teachings of which are incorporated herein by reference. The structure of FIG. 8A has the potential of being a $4F^2$ cell with maximum capacitance in one embodiment. Buried transistors may be utilized in conjunction with other trench capacitor configurations, including those disclosed herein.

Figure 9:
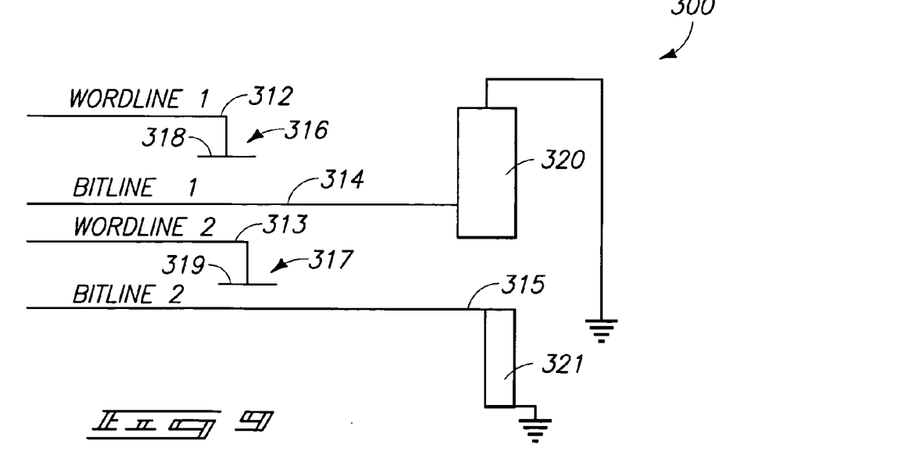
FIG. 9 is a schematic representation of an exemplary memory structure according to one embodiment.

Referring to FIG. 9, an electrical schematic representation of another memory structure 300 is shown. Memory structure 300 may be implemented within memory 104 to store digital information in one embodiment.

Structure 300 comprises a plurality of separate wordlines 312, 313, a plurality of separate bitlines 314, 315, a plurality of transistors 316, 317 having respective gates 318, 319 and a plurality of capacitors 320, 321 in the depicted exemplary arrangement. Structure 300 comprises two quasi-independent storage cells corresponding to capacitors 320, 321 (e.g., using respective ones of independent wordlines 312, 313, bitlines 314, 315 and associated with respective sense amplifiers (not shown)). For example, capacitor 320 may be arranged to store a first bit of digital information and capacitor 321 may be arranged to store a second bit of digital information. Wordlines 312, 313 are configured to control the reading and writing of digital information of bitlines 314, 315 with respect to respective capacitors 320, 321. Accordingly, capacitors 320, 321 are individually configured to store an electrical signal or charge of a respective bit of digital information in one arrangement. In the illustrated example, capacitors 320, 321 of memory structure 300 comprise independent storage nodes permitting storage of two bits of digital information.

In one embodiment, capacitors 320, 321 comprise different capacitive structures. For example, capacitor 320 may comprise a stacked capacitor while capacitor 321 may comprise a trench capacitor in one embodiment. The embodiment of FIG. 9 may have the largest tolerance of the disclosed embodiments for process variations inasmuch as any systematic differences of the capacitances of the capacitors 320, 321 should not significantly degrade system operability, with the downside of using plural complete wiring systems of increased complexity compared with the other disclosed embodiments.

Figures 10, 11:
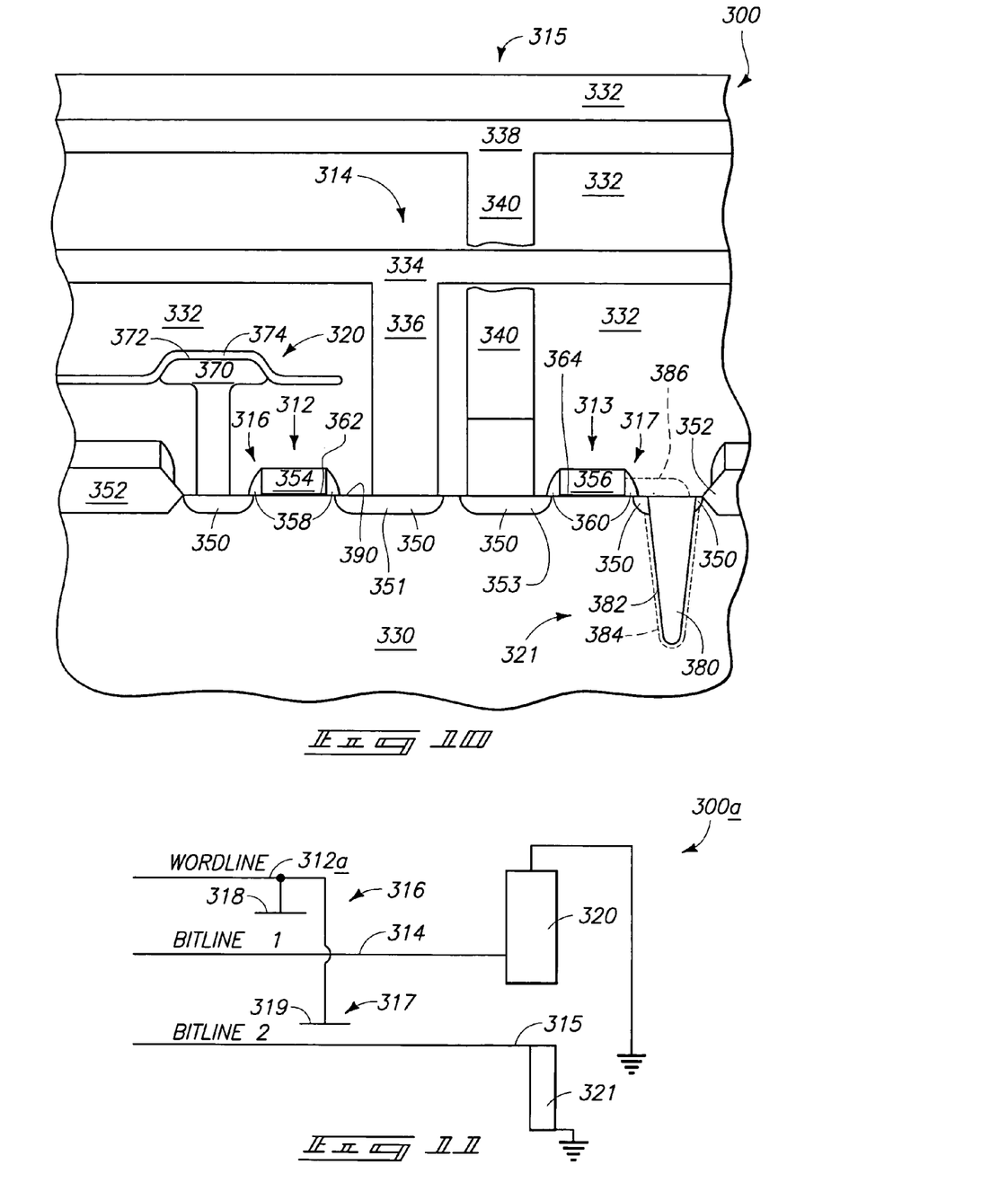
FIG. 10 is an illustrative representation of an exemplary configuration of the memory structure shown in FIG. 9.
FIG. 11 is a schematic representation of an exemplary memory structure generally corresponding to the memory structure of FIG. 10 in accordance with another embodiment.

Referring to FIG. 10, an exemplary physical representation of memory structure 300 is shown. Memory structure 300 comprises a semiconductive substrate 330 (e.g., p-type material). Interlayer dielectric material 332 is provided to insulate conductive or semiconductive material. First bitline material 334 is provided coupled with a first bitline contact 336. Bitline material 334 and bitline contact 336 may correspond to bitline 314 of FIG. 9. Second bitline material 338 is provided coupled with a first bitline contact 340. Bitline material 338 and bitline contact 340 may correspond to bitline 315 of FIG. 9. As described below, structure 300 embodies plural capacitors 320, 321 of FIG. 9. Capacitors 320, 321 may be formed laterally adjacent to one another as shown, and arranged in a checkerboard configuration (e.g., in an unillustrated plan view). Bitlines 314, 315 may be offset from one another as illustrated by the partial view of bitline contact 340 in the exemplary embodiment of FIG. 10. Two separate conductive (e.g., metal) layers of bitline material 334, 338 are shown. Other configurations are possible in other design layouts.

A plurality of active areas 350 are formed using semiconductive substrate 330. Field oxide regions 352 are formed intermediate substrate 330 and dielectric material 332. Active areas 350 coupled with bitlines 314, 315 may comprise respective node locations 351, 353. Wordline material 354, 356 is formed adjacent to respective bitline contacts 336, 340. Wordline material 354, 356 may comprise polysilicon intermediate respective insulative spacers 358, 360 and form wordlines 312, 313 of FIG. 9. Wordline material 354, 356 has associated gate oxide regions 362, 364 and form respective transistors 316, 317 (wordlines 312, 313 may comprise gates 318, 319 of FIG. 9) with associated adjacent active areas 350, respectively.

Memory structure 300 comprises capacitors 320, 321. As shown in the exemplary embodiment, capacitors 320, 321 respectively comprise a stacked capacitor and a trench capacitor. Capacitors 320, 321 individually operate to store a single bit of information responsive to operation of respective transistors 316, 317.

Capacitor 320 configured as a stacked capacitor comprises an electrical storage component comprising a metal or polysilicon storage structure 370, intermediate dielectric layer 372, and a metal or polysilicon cell plate 374 in the depicted embodiment.

Capacitor 321 configured as a trench capacitor comprises an electrical storage component comprising a polysilicon storage structure 380, intermediate dielectric layer 382, and a heavily doped substrate region 384 in the depicted embodiment. A polysilicon strap 386 may be provided to provide electrical communication between polysilicon storage structure 380 and a drain of transistor 317.

For FIG. 10, a horizontal reference line may be defined wherein a substantial portion of the storage component of capacitor 320 is formed elevationally above the horizontal reference line and a substantial portion of the storage component of capacitor 321 is formed elevationally below the horizontal reference line. The horizontal reference line may correspond to a surface 390 of substrate 330 in the depicted example.

As mentioned previously, capacitors 320, 321 are coupled with respective bitlines 314, 315. Transistors 316, 317 may be controlled by the respective wordlines 312, 313 to selectively couple respective capacitors 320, 321 with respective bitlines 314, 315 to enable different bits of information to be independently written to or read from capacitors 320, 321. Alternately, capacitors 320, 321 may store an electrical charge of a single bit of digital information responsive to control of transistors 316, 317.

Referring to FIG. 11, an electrical schematic representation of another memory structure 300a is shown illustrating another embodiment of the memory structure 300 of FIGS. 9–10. Memory structure 300 may be implemented within memory 104 to store digital information in one embodiment.

Structure 300 comprises a common wordline 312a, a plurality of separate bitlines 314, 315, a plurality of transistors 316, 317 having respective gates 318, 319 and a plurality of capacitors 320, 321 in the depicted exemplary arrangement. Capacitor 320 may be arranged to store a first bit of digital information corresponding to bitline 314 and capacitor 321 may be arranged to store a second bit of digital information corresponding to bitline 315. Common wordline 312a is configured to control the reading and writing of digital information of bitlines 314, 315 with respect to respective capacitors 320, 321. Wordline material 354 and 356 of FIG. 10 may be commonly coupled in one arrangement to implement the circuit of FIG. 11. Capacitors 320, 321 are individually configured to store an electrical signal or charge of a respective bit of digital information in one arrangement. In the illustrated example, capacitors 320, 321 of memory structure 300a comprise independent storage nodes permitting two bits of digital information to be stored.

In accordance with exemplary processing to produce structures described herein, trench capacitor constructions may be initially fabricated within an underlying substrate. If desired, associated trench transistors may be fabricated during the fabrication of the trench capacitors. A plurality (e.g., one to four) levels of buried wiring for providing desired electrical connections may be constructed during or following the fabrication of trench or other buried structures. Exemplary buried wiring fabrication procedures are described in U.S. Published patent application No. US 2002/0009874 A1, having Ser. No. 09/930,521, filed Aug. 15, 2001, listing Paul A. Farrar and Wendell P. Noble as inventors, the teachings of which are incorporated by reference herein. Following formation of buried devices, planar transistors, stacked capacitors, additional conductive connections, or other desired structures may be constructed. Different wiring configurations may be used including buried or split wiring corresponding to the arrangement of the memory structure being fabricated. In one embodiment, capacitors having different capacitive types are fabricated using plural inter-penetrating arrays corresponding to the respective types of capacitive constructions. In another embodiment, a single array having alternating types of capacitive structures may be used.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A digital data apparatus comprising:
   a semiconductive substrate comprising a node location configured to receive an electrical charge of a single bit of digital information;
   a first capacitor coupled with the node location and configured to store a first portion of the electrical charge of the single bit of digital information wherein the first capacitor comprises a first type of capacitive structure;
   a second capacitor coupled with the node location and configured to store a second portion of the electrical charge of the single bit of digital information, wherein the second capacitor comprises a second type of capacitive structure different than the first type of capacitive structure;
   a transistor coupled with the node location and configured to control a flow of the first and second portions of the electrical charge of the single bit of digital information with respect to the node location and respective ones of the first and the second capacitors; and
   wherein the first and the second capacitors comprise a first capacitor pair, and further comprising a second capacitor pair coupled with the bitline via another transistor.

2. The apparatus of claim 1 wherein a substantial portion of a storage component of the first capacitor is elevationally above a horizontal reference line and a substantial portion of a storage component of the second capacitor is elevationally below the horizontal reference line.

3. The apparatus of claim 2 wherein the horizontal reference line comprises a surface of the semiconductive substrate.

4. The apparatus of claim 1 wherein the first type of capacitive structure comprises a stacked capacitor, and the second type of capacitive structure comprises a trench capacitor.

5. The apparatus of claim 1 wherein the first and the second capacitors comprise a cell configured to store the single bit of digital information.

6. The apparatus of claim 1 further comprising a common bitline, and wherein both of the first and the second capacitors are coupled with the common bitline via the transistor.

7. The apparatus of claim 1 further comprising processing circuitry coupled with the bitline and configured to control a content of the single bit of digital information comprising one of a plurality of logical states.

8. The apparatus of claim 1 further comprising processing circuitry configured to access the single bit of digital information from the first and the second capacitors.

9. The apparatus of claim 1 further comprising processing circuitry configured to control writing of the single bit of digital information to the first and the second capacitors.

10. A digital data apparatus comprising:
    a semiconductive substrate;
    a first capacitor configured to store a first electrical charge, wherein the first capacitor comprises a first type of capacitive structure;
    a second capacitor configured to store a second electrical charge, wherein the second capacitor comprises a second type of capacitive structure different than the first type of capacitive structure;
    a bitline configured to conduct the first and the second electrical charges; and
    a plurality of transistors formed using the semiconductive substrate and coupled with the bitline, wherein the transistors are individually configured to control storage of a respective one of the first and the second electrical charges with respect to a respective one of the first and the second capacitors.

11. The apparatus of claim 10 wherein the first and the second electrical charges correspond to different bits of digital information.

12. The apparatus of claim 10 wherein the first and the second electrical charges correspond to a single bit of digital information.

13. The apparatus of claim 10 wherein the first type of capacitive structure comprises a stacked capacitor, and the second type of capacitive structure comprises a trench capacitor.

14. The apparatus of claim 10 wherein one of the first and the second capacitors comprises a trench capacitor, and a respective one of the transistors associated with the trench capacitor is formed below a surface of the semiconductive substrate adjacent a sidewall of a trench of the trench capacitor.

15. The apparatus of claim 10 further comprising processing circuitry coupled with the bitline and configured to individually control the first and the second electrical charges to individually correspond to one of a plurality of logical states.

16. A digital data apparatus comprising:
    a semiconductive substrate;
    a first capacitor configured to store a first electrical charge, wherein the first capacitor comprises a first type of capacitive structure;
    a second capacitor configured to store a second electrical charge, wherein the second capacitor comprises a second type of capacitive structure different than the first type of capacitive structure;
    a common conductive structure configured to effect storage of the first and the second electrical charges using respective ones of the first capacitor and the second capacitor; and
    a plurality of transistors formed using the semiconductive substrate and individually associated with one of the first capacitor and the second capacitor.

17. The apparatus of claim 16 wherein the common conductive structure comprises a bitline configured to conduct the first and the second electrical charges.

18. The apparatus of claim 16 wherein the common conductive structure comprises a wordline configured to control an operation of the transistors.

19. The apparatus of claim 16 wherein the first type of capacitive structure comprises a stacked capacitor, and the second type of capacitive structure comprises a trench capacitor.

20. The apparatus of claim 19 wherein the stacked capacitor and the trench capacitor are individually configured to store a portion of a charge of a single bit of information.

21. The apparatus of claim 19 wherein the stacked capacitor and the trench capacitor are associated with separate bitlines and the common conductive structure comprises a common wordline.

22. The apparatus of claim 19 wherein the stacked capacitor and the trench capacitor are associated with separate wordlines and the common conductive structure comprises a common bitline.

23. The apparatus of claim 19 wherein the stacked capacitor and the trench capacitor comprise respective storage nodes associated with separate wordlines and separate bitlines forming two quasi independent memories.

24. A digital data apparatus comprising:
a semiconductive substrate comprising a plurality of node locations;
a first capacitor configured to store an electrical charge for a first bit of digital information, wherein the first capacitor comprises a first type of capacitive structure coupled with a first of the node locations;
a second capacitor configured to store an electrical charge for a second bit of digital information, wherein the second capacitor comprises a second type of capacitive structure different than the first type of capacitive structure and coupled with a second of the node locations;
a plurality of bitlines individually configured to conduct an electrical charge with respect to a respective one of the first and second node locations; and
a plurality of transistors coupled with respective ones of the bitlines, wherein the transistors are individually configured to control a flow of the respective electrical charges intermediate respective ones of the first and the second capacitors and the respective ones of the bitlines.

25. The apparatus of claim 24 wherein one of the first and the second capacitors comprises a trench capacitor, and a respective one of the transistors associated with the trench capacitor is formed below a surface of the semiconductive substrate adjacent a sidewall of a trench of the trench capacitor.

26. The apparatus of claim 24 wherein the first and the second capacitors are formed laterally adjacent to one another.

27. The apparatus of claim 24 wherein the first type of capacitive structure comprises a stacked capacitor, and the second type of capacitive structure comprises a trench capacitor.

28. The apparatus of claim 24 wherein the first and the second capacitors comprise independent storage devices configured to store the first and the second bits of digital information independent of one another.

29. The apparatus of claim 24 further comprising processing circuitry coupled with the bitlines and configured to individually control the first and the second bits of digital information into one of a plurality of logical states.

30. A digital data apparatus comprising:
substrate means having an associated horizontal reference line;
first storage means for storing a first electrical charge corresponding to a single bit of digital information, wherein the first storage means is positioned elevationally above the horizontal reference line;
second storage means for storing a second electrical charge corresponding to the single bit of digital information, wherein the second storage means is positioned elevationally below the horizontal reference line; and
control means for selectively communicating respective ones of the first and the second electrical charges with respect to respective ones of the first storage means and the second storage means.

31. The apparatus of claim 30 wherein the horizontal reference line is substantially parallel to a surface of the substrate means.

32. The apparatus of claim 30 wherein the horizontal reference line comprises a surface of the substrate means.

33. The apparatus of claim 30 wherein the first storage means comprises a stacked capacitor and the second storage means comprises a trench capacitor.

34. A digital data apparatus comprising:
memory comprising:
a semiconductive substrate;
a trench capacitor configured to store a first electrical charge;
a stacked capacitor configured to store a second electrical charge;
a bitline configured to conduct the first and the second electrical charges; and
a plurality of transistors formed using the semiconductive substrate and coupled with the bitline, wherein the transistors are individually configured to control storage of a respective one of the first and the second electrical charges with respect to a respective one of the first and the second capacitors; and
processing circuitry electrically coupled with the memory and configured to control the generation of the first and the second electrical charges.

35. A digital data operational method comprising:
providing a plurality of capacitors comprising different types of capacitive structures using a semiconductive substrate;
communicating a plurality of electrical charges using a common bitline coupled with the capacitors;
storing one of the electrical charges from the bitline using one of the capacitors having a first type of capacitive structure;
storing an other of the electrical charges from the bitline using an other of the capacitors having a second type of capacitive structure different than the first type of capacitive structure; and
wherein the one and the other electrical charges comprise respective different bits of digital information.

36. The method of claim 35 wherein the providing comprises providing the one capacitor elevationally above a horizontal reference line and providing the other capacitor elevationally below the horizontal reference line.

37. The method of claim 35 wherein the one capacitor comprises a stacked capacitor and the other capacitor comprises a trench capacitor.

38. The method of claim 35 wherein the storings of the one and the other electrical charges individually comprise storing using a respective one of a plurality of transistors, and wherein one of the transistors is formed adjacent a sidewall of the other capacitor comprising a trench capacitor.

39. The method of claim 35 further comprising processing the electrical charges using processing circuitry.

* * * * *